United States Patent
Mihajlovic et al.

(10) Patent No.: US 9,953,692 B1
(45) Date of Patent: Apr. 24, 2018

(54) SPIN ORBIT TORQUE MRAM MEMORY CELL WITH ENHANCED THERMAL STABILITY

(71) Applicant: SANDISK TECHNOLOGIES LLC, Plano, TX (US)

(72) Inventors: Goran Mihajlovic, San Jose, CA (US); Ching Hwa Tsang, Sunnyvale, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/485,049

(22) Filed: Apr. 11, 2017

(51) Int. Cl.
 *G11C 11/00* (2006.01)
 *G11C 11/16* (2006.01)
 *H01L 43/08* (2006.01)
 *H01L 43/10* (2006.01)

(52) U.S. Cl.
 CPC ........ *G11C 11/1675* (2013.01); *G11C 11/161* (2013.01); *H01L 43/08* (2013.01); *H01L 43/10* (2013.01)

(58) Field of Classification Search
 CPC .............. G11C 11/161; G11C 11/1673; G11C 11/1675; G11C 11/18; G11C 16/30
 USPC .................................. 365/148, 158, 171, 173
 See application file for complete search history.

(56) References Cited

U.S. PATENT DOCUMENTS

| | | | |
|---|---|---|---|
| 7,149,106 B2 | 12/2006 | Mancoff | |
| 7,961,493 B2 * | 6/2011 | Karg | H01L 27/226 365/145 |
| 8,724,376 B2 | 5/2014 | Eigler | |
| 9,105,832 B2 * | 8/2015 | Buhrman | G11C 11/18 |
| 9,379,314 B2 | 6/2016 | Park | |
| 9,576,631 B2 * | 2/2017 | Buhrman | G11C 11/18 |
| 2001/0035545 A1 | 11/2001 | Schuster-Woldan | |
| 2002/0008989 A1 | 1/2002 | Honigschmid | |
| 2008/0258247 A1 | 10/2008 | Mancoff | |
| 2012/0313191 A1 | 12/2012 | Whig | |
| 2014/0038310 A1 | 2/2014 | Abraham | |
| 2014/0070341 A1 | 3/2014 | Beach | |
| 2014/0264511 A1 | 9/2014 | De Brosse | |
| 2016/0276576 A1 | 9/2016 | Xia | |
| 2017/0125078 A1 * | 5/2017 | Mihajlovic | G11C 11/161 |

OTHER PUBLICATIONS

Makarov, et al., "SOT-MRAM based on 1 Transistor-1MTJ-Cell Structure," 2015 15th Non-Volatile Memory Technology Symposium (NVMTS 2015) Oct. 12-14, 2015, Beijing, China.

Sbiaa, et al., "Materials with perpendicular magnetic anisotropy for magnetic random access memory," Phys. Status Solidi RRL 5, No. 12, 413-419. DOI:10.1002/pssr.201105420, Oct. 2011.

Henley, Lecture 5.3 Antiferromagnetic and Frustrated Order, Fourier Approach to Classical Magnetic States, pp. 15-23, 2007.

Stiles, et al., "Coercivity in exchange-bias bilayers," The American Physical Society, Physical Review B 63 064405, 2001.

(Continued)

*Primary Examiner* — Gene Audong

(74) *Attorney, Agent, or Firm* — Vierra Magen Marcus LLP

(57) ABSTRACT

An in-plane SOT MRAM non-volatile memory cell has enhanced thermal stability due to coercive pinning provided by an adjacent antiferromagnetic layer that has a thickness that is less than a minimum critical thickness needed to provide exchange bias.

22 Claims, 7 Drawing Sheets

(56) References Cited

OTHER PUBLICATIONS

Ali, "Antiferromagnetic layer thickness dependence of the IrMn/Co exchange-bias system," The American Physical Society, Physical Review B 68, 214420, 2003.

McCord, et al., "Dynamic magnetic anisotropy at the onset of exchange bias: The Nife/IrMn ferromagnet/antiferromagnet system," The American Physical Society, Physical Review B 70, 094420, 2004.

Tshitoyan, et al., "Electrical manipulation of ferromagnetic NiFe by antiferromagnetic IrMn," American Physical Society, Physical Review B 92, 214406, 2015.

Ou, et al., "Strong spin Hall effect in the antiferromagnet PtMn," American Physical Society, Physical Review B 93, 220405 (R), 2016.

Freitas, "Storage Class Memory, Technology and Use," IBM Corporation, IBM Almaden Research Center, Jul. 22, 2008.

\* cited by examiner

⊙ = OUT of the page
⊗ = IN the page

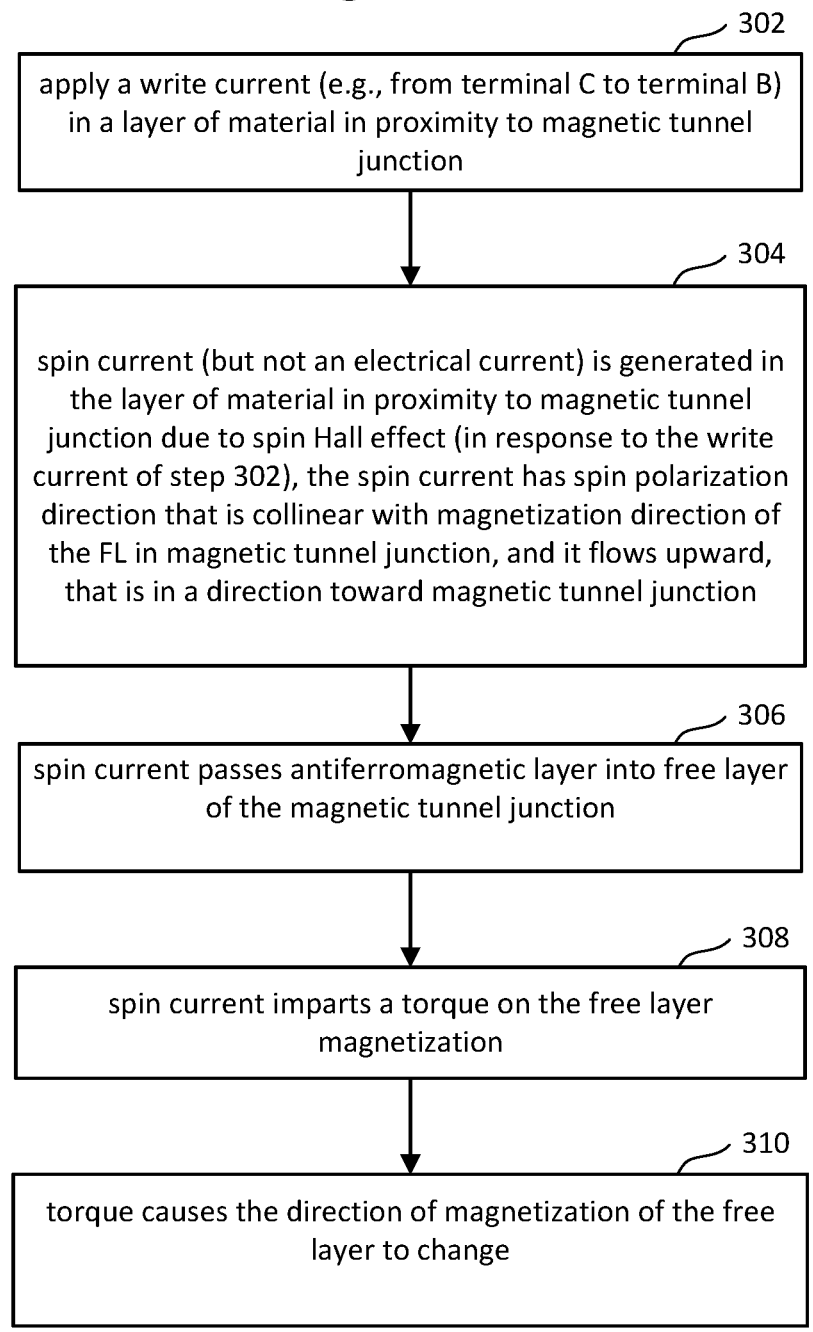

SPIN ORBIT TORQUE MRAM MEMORY CELL WITH ENHANCED THERMAL STABILITY

BACKGROUND

Memory is widely used in various electronic devices such as cellular telephones, digital cameras, personal digital assistants, medical electronics, mobile computing devices, non-mobile computing devices and data servers. Memory may comprise non-volatile memory or volatile memory. A non-volatile memory allows information to be stored and retained even when the non-volatile memory is not connected to a source of power (e.g., a battery).

One example of a non-volatile memory is magnetoresistive random access memory (MRAM), which uses magnetization to represent stored data, in contrast to other memory technologies that use electronic charges to store data. Generally, MRAM includes a large number of magnetic memory cells formed on a semiconductor substrate, where each memory cell represents one data bit. A bit of data is written to a memory cell by changing the direction of magnetization of a magnetic element within the memory cell, and a bit is read by measuring the resistance of the memory cell (e.g., low resistance typically represents a "0" bit and high resistance typically represents a "1" bit).

FIG. 1A is a schematic perspective view of an example prior art MRAM memory cell 100 that makes use of spin orbit torque (SOT) for switching. In general, Spin Hall Effect (SHE) may be used to generate spin current flowing in a direction transverse to the direction of an applied electrical current. Memory cell 100 includes three terminals A, B and C; magnetic tunnel junction (MTJ) 101; and SHE layer 120. MTJ 101 comprises pinned layer (PL) 102, inter-layer coupling (ILC) layer 104, reference layer (RL) 106, tunnel barrier (TB) 108 and free layer (FL) 110. For an in-plane SOT memory cell, free layer (FL) 110 has a direction of magnetization that can be switched between INTO the page and OUT of the page. Reference layer (RL) 106 has a direction of magnetization that is INTO the page. Pinned layer (PL) 102 has a direction of magnetization that is OUT of the page. The ILC layer 104 promotes a strong antiferromagnetic (i.e., anti-parallel) coupling between PL (102) and RL (106), such that their net magnetic moment mostly cancels, thus greatly reducing unwanted stray field influence on the free layer.

To write data to memory cell 100, a write current 122 is applied between terminal B and terminal C. Reading is achieved by passing current between terminal A and terminal B in order to sense the resistance of memory cell 100. If the direction of magnetization of free layer (FL) 110 is parallel to the direction of magnetization of the RL (106), for example INTO the page, then memory cell 100 has a lower resistance. If the direction of magnetization of free layer (FL) 110 is antiparallel to the direction of magnetization of the RL (106), for example OUT the page, then memory cell 100 has a higher resistance.

FIG. 1B is a top view of memory cell 100, with bidirectional arrow 130 indicating the switchable direction of magnetization of free layer 110. As depicted, the shape of MTJ 101 is elliptical in order to maintain thermal stability. Namely, the elliptical shape of the FL introduces magnetic shape anisotropy which provides energy barrier against thermally activated magnetization reversal of the FL thus making FL magnetization thermally stable. The shape of SHE layer 120 is rectangular.

The primary advantage of the SOT-switching design that exploits the SHE is that the write current 122 passes solely through the SHE layer 120, and does not flow through the tunnel barrier 108. This avoids long term degradation of the tunnel barrier by the switching current. However, as the size of memory cell 100 is scaled down, the memory cell 100 loses its ability to retain data. This is because the magnetic shape anisotropy energy is directly proportional to the volume of the FL and as this volume is reduced the energy barrier against thermally activated magnetization reversal decreases, eventually to the point that thermally stable magnetization of the FL cannot be maintained.

BRIEF DESCRIPTION OF THE DRAWINGS

Like-numbered elements refer to common components in the different figures.

FIG. 3 is a flow chart describing one embodiment of a process for writing to a MRAM memory cell.

DETAILED DESCRIPTION

To improve data retention (i.e. the magnetic thermal stability of an in-plane SOT MRAM non-volatile memory cell), a coercive pinning mechanism is provided by an antiferromagnetic layer adjacent to the free layer. One embodiment includes ferromagnetic material that has a switchable direction of magnetization and antiferromagnetic material in contact with the ferromagnetic material. In one example implementation, the ferromagnetic material is the free layer of a magnetic tunnel junction and the antiferromagnetic material has a thickness that is less than a minimum critical thickness needed to provide exchange bias for the free layer. More details are explained below.

Figure 1A:
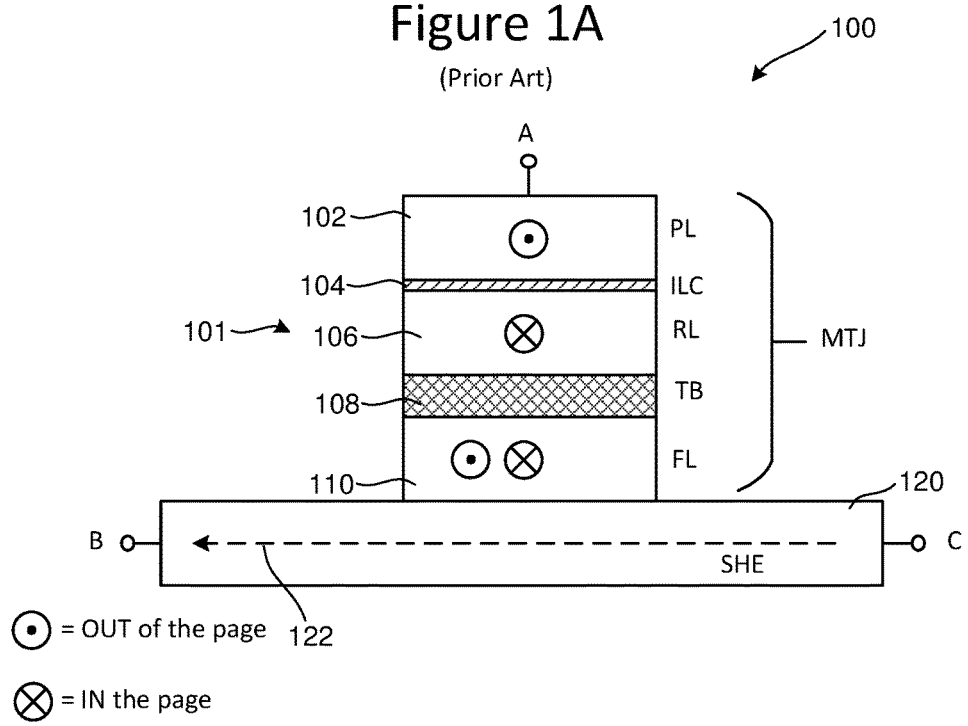
FIG. 1A is a block diagram of a side view of a MRAM memory cell.
Figure 1B:
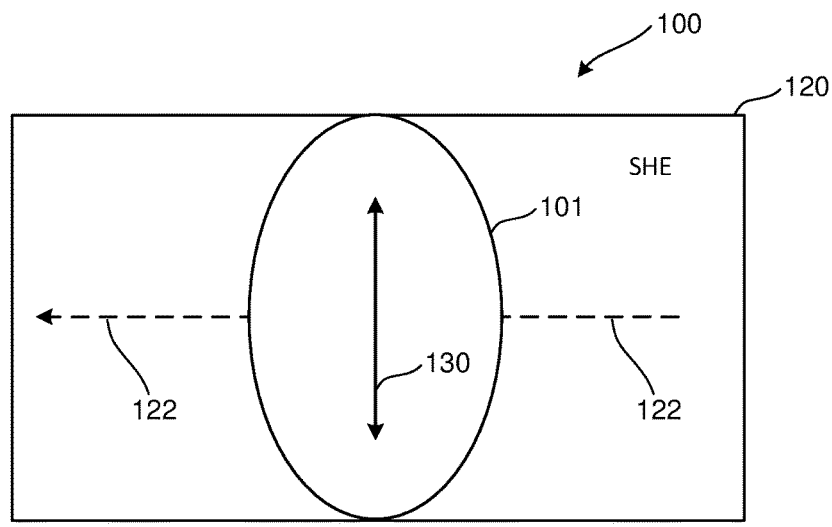
FIG. 1B is a block diagram of a top view of a MRAM memory cell.
Figure 2A:
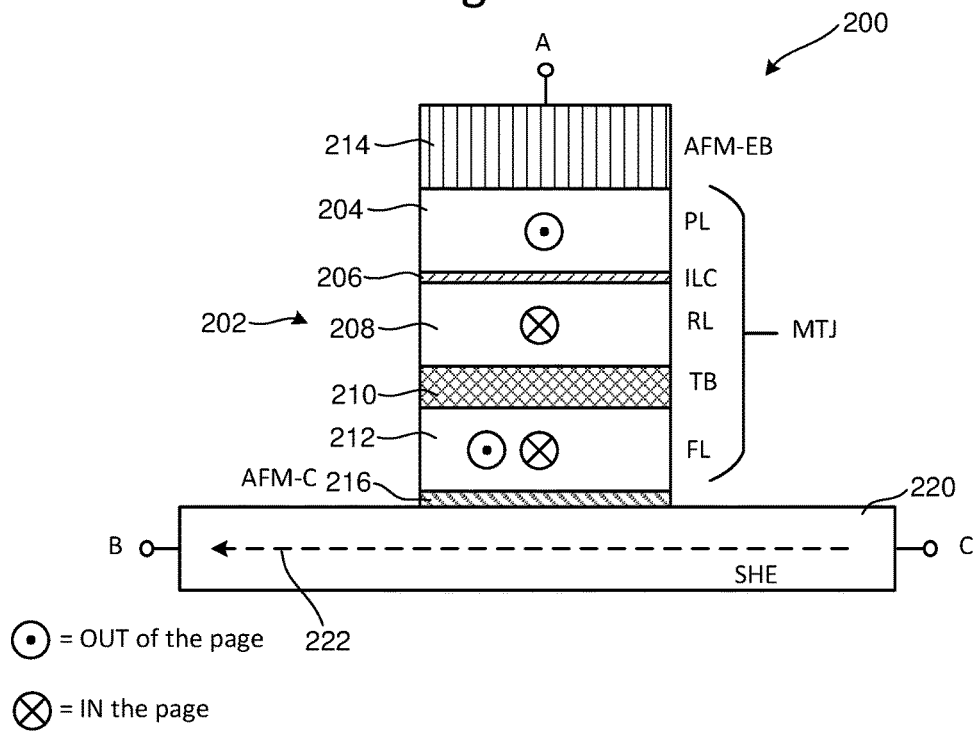
FIG. 2A is a block diagram of a side view of a MRAM memory cell.
Figure 2B:
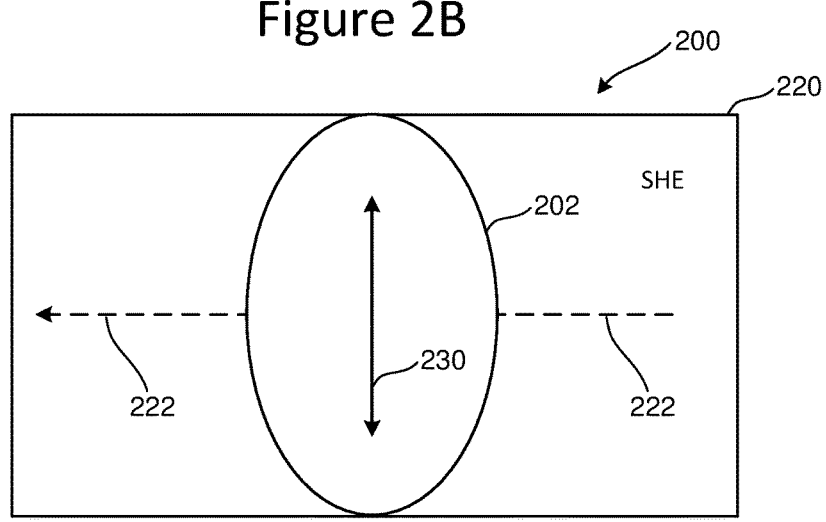
FIG. 2B is a block diagram of a top view of a MRAM memory cell.

FIG. 2A is a schematic perspective view of one embodiment of a MRAM memory cell 200 that exploits SHE and makes use of spin orbit torque (SOT) for switching. FIG. 2B is a top view of memory cell 200. For purposes of this document, a memory cell is a unit of storage in a memory system. Memory cell 200 includes three terminals A, B and C; magnetic tunnel junction (MTJ) 202; and SHE layer 220. SHE layer is typically a heavy metal with high spin-orbit coupling (and generally corresponding high resistivity and short spin diffusion length), for example, Platinum, Tantalum or Tungsten. If a current is run in-plane through the SHE layer, spin polarized current is generated in perpendicular direction (flowing up towards the FL) which exerts torque on the FL via spin transfer mechanism and can switch the magnetization of the FL. Terminals B and C are connected to SHE layer 220.

In general, a magnetic tunnel junction (MTJ) is an apparatus comprising two ferromagnets separated by a thin insulator. Thus, one embodiment of MTJ 202 includes a pinned layer, a free layer and a tunnel barrier between the pinned layer and the free layer. MTJ 202 can also have more than three layers. For example, as depicted in FIG. 2A, MTJ 202 comprises pinned layer (PL) 204, inter-layer coupling (ILC) layer 206, reference layer (RL) 208, tunnel barrier (TB) 210 and free layer (FL) 212. Pinned layer 204 and reference layer 208 have fixed magnetizations, meaning that their direction of magnetization does not change. Pinned layer 204 can be many different types of materials including (but not limited to) multiple layers of Cobalt and/or an alloy of Cobalt and Iron. Reference layer 208 can be many different types of materials including (but not limited to) multiple layers of Cobalt and an alloy of Cobalt, Iron and Boron. In one example, ILC layer 104 is made of Ruthenium; however, other materials can also be used. Pinned layer 204 has a direction of magnetization that is opposite in direction to reference layer 208. For example, FIG. 2A shows the direction of magnetization of pinned layer 204 being OUT of the page and the direction of magnetization of reference layer 208 being INTO the page. To a large degree, the magnetization of reference layer 208 cancels out the magnetization of pinned layer 204 (or vice versa) to create in aggregate a combined layer with close to zero net magnetization. The ILC layer 206 promotes this antiparallel (i.e. antiferromagnetic) coupling between PL 204 and RL 208.

In one example, tunnel barrier 210 is made of Magnesium Oxide (MgO); however, other materials can also be used. Tunnel barrier 210 is positioned between free layer 212 and the one or more layers of fixed magnetization; thus, in one embodiment tunnel barrier 210 is positioned between free layer 212 and reference layer 208. Free layer 212 is a ferromagnetic metal that possess the ability to change/switch its direction of magnetization. Multilayers based on transition metals like Co, Fe and their alloys can be used to form free layer 212. In one embodiment, free layer 212 comprises an alloy of Cobalt, Iron and Boron. Free layer (FL) 212 has a direction of magnetization that can be switched between INTO the page and OUT of the page. If the direction of magnetization of FL 212 is parallel to the direction of magnetization of the RL 208, then memory cell 200 has a lower resistance. If the direction of magnetization of FL 212 is antiparallel to the direction of magnetization of the RL 208, then memory cell 200 has a higher resistance. Low resistance represents a "0" bit and high resistance represents a "1" bit, or vice versa.

The data ("0" or "1") stored in memory cell 200 is read by measuring the resistance of the memory cell 200. As depicted, memory cell 200 includes three terminals: A, B and C. Reading is achieved by passing an electrical current between terminal A and terminal B in order to sense the resistance of memory cell 200. To write data to memory cell 200, an electrical write current 222 is applied between terminal B and terminal C in order to change the resistance of memory cell 200 by switching the direction of magnetization of free layer 212. Depending on the sign of the spin Hall effect in the SHE layer 220 (which depends on the choice of SHE material) for a given polarity of electrical current 222, magnetization direction of the FL can be uniquely set in either INTO the page or OUT of the page direction, i.e. either parallel or antiparallel to the magnetization direction of the RL. Thus by choosing polarity of write current 222 we can write "0" or "1" bit in the memory cell 200.

Memory cell 200 also includes two antiferromagnetic layers: antiferromagnetic layer (AFM-EB) 214 and antiferromagnetic layer (AFM-C) 216. In materials that exhibit anti-ferromagnetism, the magnetic moments of atoms or molecules (related to the spins of electrons) align in a regular pattern with neighboring spins (on different sub-lattices) pointing in opposite directions to realize zero net magnetization. That is magnetic moments align themselves into opposite, or antiparallel, arrangements throughout the material so that it exhibits almost no aggregate external magnetism.

When an antiferromagnetic material is in contact with a ferromagnetic material, the ferromagnetic material will couple to the antiferromagnetic material at the interface such that there will be a strong interaction between the magnetic moments at the interface between the antiferromagnetic material and the ferromagnetic material in order to align them, thereby creating a preferred magnetization direction for the ferromagnet. This phenomenon is called "exchange bias." Due to the coupling between the antiferromagnetic material and the ferromagnetic material, it is significantly more difficult to change the direction of magnetization of the ferromagnetic material. In many cases, when a magnetic field is applied to a ferromagnetic material that is being subjected to exchange bias, it may be possible to temporarily change or partially change the direction of magnetization of the ferromagnetic material; however, once the magnetic field is removed then the direction of magnetization of the ferromagnetic material will (in most cases) immediately and automatically revert back to its original state. The antiferromagnetic material acts as a restoring force or anchor for the ferromagnetic material that is being subjected to exchange bias. In that regard, antiferromagnetic layer (AFM-EB) 214, which is in contact with pinned layer 204, provides exchange bias for pinned layer 204 in order to anchor the direction of magnetization of pinned layer 204 to remain OUT of the page. Terminal A is connected to antiferromagnetic layer 214.

It has been observed that for many antiferromagnetic materials, if the material is not sufficiently thick then exchange bias will not occur. More specifically, the onset of exchange biasing appears at a "minimum critical thickness" and continues to increase as the thickness of the antiferromagnetic material increases up to a "saturated thickness" where the amount of exchange bias saturates. It has also been observed that at or around the minimum critical thickness (including just under the minimum critical thickness and just over the minimum critical thickness), the antiferromagnetic material can provide significant coercivity (that is uniaxial instead of unidirectional magnetic anisotropy) to an adjacent ferromagnetic material. Thus, an antiferromagnetic material that has a thickness that is less than the critical minimum thickness, but close to the critical minimum thickness, will not provide exchange bias but will provide coercivity to a ferromagnetic material in contact with the antiferromagnetic material. This coercivity will increase the energy barrier against thermally activated magnetization reversal of the FL for both magnetization directions, unlike exchange bias mechanism that does that for only one magnetization direction and is therefore not suitable for memory applications where two stable magnetization directions are required. Therefore, this coercivity will enhance thermal stability of the FL, in addition to shape anisotropy energy described before. One example of an antiferromagnetic material is IrMn, which has a minimum critical thickness of 20 Å.

It is proposed to use an antiferromagnetic material in contact with free layer 212 to provide coercivity (making free layer 212 more stable and able to better retain data) but not provide exchange bias (as exchange bias would prevent the switching of free layer 212). In that regard, antiferromagnetic layer (AFM-C) 216, positioned between free layer 212 and SHE layer 220 so that it is in contact with free layer 212, has a thickness that is less than a minimum critical thickness needed to provide exchange bias for free layer 212 (a ferromagnetic material); however, antiferromagnetic layer 216 does provide coercivity for free layer 212. Thus, the atomic interaction between antiferromagnetic layer 216 and free layer 212 makes it more difficult to switch the direction of magnetization of free layer 212 (but it is switchable) for both magnetization directions, which makes free layer 212 more stable and better at retaining data.

In one embodiment, antiferromagnetic layer (AFM-C) 216 is IrMn, at a thickness between 17-18 Å, while antiferromagnetic layer (AFM-EB) 214 is IrMn, at a thickness of >40 Å. Other materials that can be used for antiferromagnetic layer (AFM-C) 216 include FeMn, PtMn, and NiMn.

FIG. 2B is a top view of memory cell 200, with bidirectional arrow 230 indicating the switchable direction of magnetization of the free layer 212. As depicted, the shape of MTJ 202 is elliptical in order to maintain thermal stability via magnetic shape anisotropy energy. However, the shape of SHE layer 220 is rectangular. In one embodiment, the shape of antiferromagnetic layer 216 is elliptical to assume the same shape as MTJ 202. In another embodiment, the shape of antiferromagnetic layer 216 is rectangular to assume the same shape as SHE layer 220.

FIG. 3 is a flow chart describing one embodiment of a method for writing data to memory cell 200. As discussed above, writing to memory cell 200 includes changing the direction of magnetization of free layer 212 between parallel and anti-parallel with the direction of magnetization of reference layer 208. When the direction of magnetization of free layer 212 is parallel to the direction of magnetization of reference layer 208, then the resistance of memory cell 200 is low, corresponding to data "0." When the direction of magnetization of free layer 212 is parallel to the direction of magnetization of reference layer 208, then the resistance of memory cell 200 is high, corresponding to data "1."

In step 302 of FIG. 3, a write current 222 is applied in SHE layer 220 between terminals B and C. For example, FIG. 2A shows write current 222 applied in SHE layer 220 from terminal C to terminal B. Alternatively, the write current can be applied in the opposite direction, from terminal B to terminal C, to change the direction of magnetization in the opposite way. In step 304, spin current (but not electrical current) is generated in the SHE layer 220 due to spin Hall effect in response to the write current of step 302. This spin current has spin polarization direction that is collinear with magnetization direction of the FL, and it flows upward, that is in a direction toward MTJ 202. That is, SHE layer 220 acts as a source of spin current for MTJ 202. In step 306, spin current passes antiferromagnetic layer 216 into free layer 212 and imparts a torque on the free layer magnetization in step 308. In response to that torque, the direction of magnetization of the free layer will change in step 310. For example, the torque causes the direction of magnetization in free layer 212 to change to OUT, thus, the direction of magnetization in free layer 212 becomes anti-parallel to the direction of magnetization of reference layer 208. As mentioned above, in the example of FIG. 2A, applying the write current from terminal B to terminal C (rather than from terminal C to terminal B) will result in a torques that causes the direction of magnetization in free layer 212 to change to IN, thus, the direction of magnetization in free layer 212 becomes parallel to the direction of magnetization of reference layer 208.

Figure 4A:
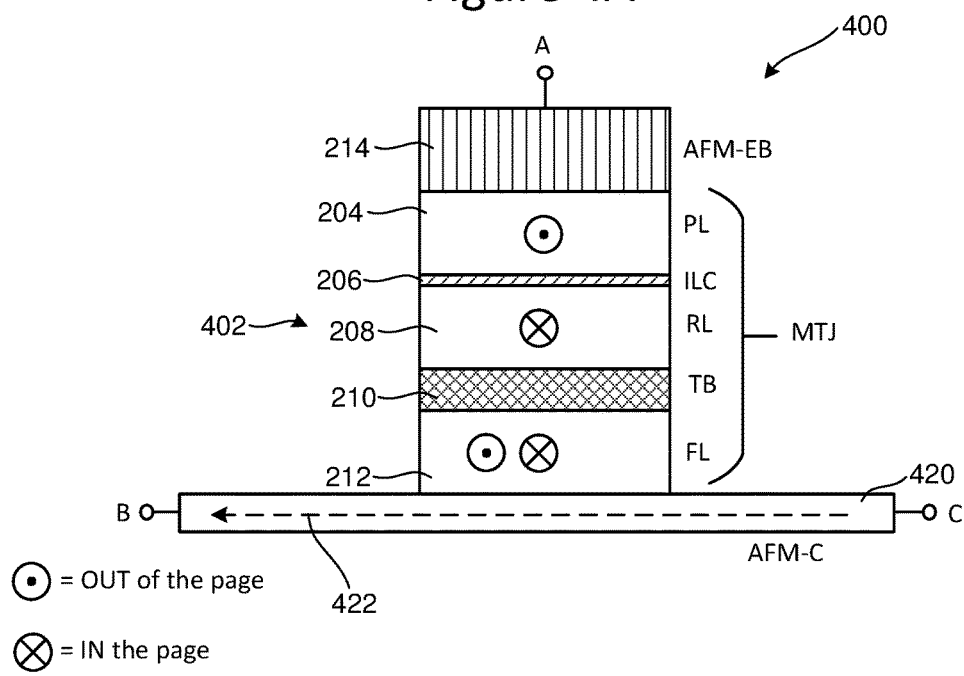
FIG. 4A is a block diagram of a side view of a MRAM memory cell.
Figure 4B:
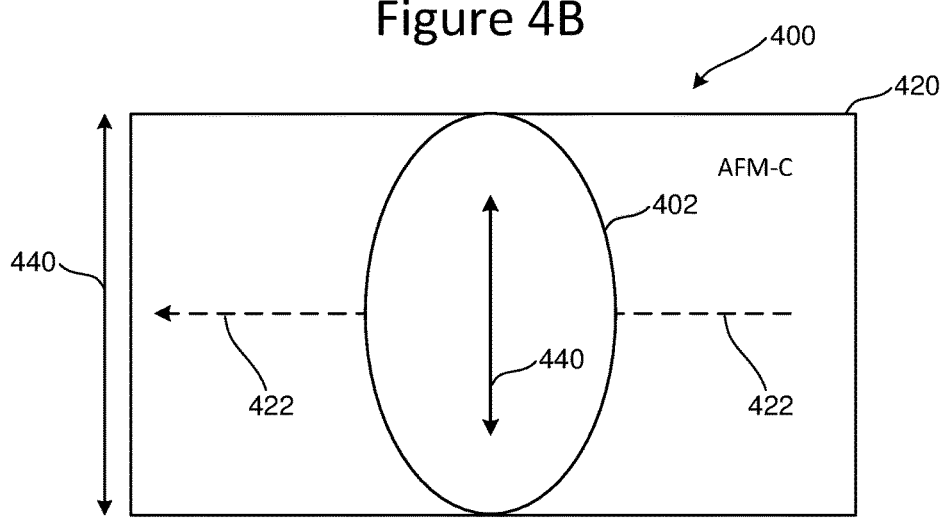
FIG. 4B is a block diagram of a top view of a MRAM memory cell.

FIG. 4A is a schematic perspective view of another embodiment of a MRAM memory cell 400 that exploits SHE and makes use of SOT for switching. FIG. 4B is a top view of memory cell 400. Memory cell 400 includes three terminals A, B and C; and magnetic tunnel junction (MTJ) 402. As depicted, MTJ 402 comprises the same pinned layer (PL) 204, inter-layer coupling (ILC) layer 206, reference layer (RL) 208, tunnel barrier (TB) 210 and free layer (FL) 212 as MTJ 202 of FIG. 2A. Memory cell 400 also includes the same antiferromagnetic layer (AFM-EB) 214 as memory cell 200 of FIG. 2A, at a conventional thickness (e.g., a thickness greater than the minimum critical thickness) to provide exchange bias for the pinned layer 204. Terminal A is connected to antiferromagnetic layer 214.

Below MTJ 402, and in contact with free layer 212 of MTJ 402, is antiferromagnetic layer (AFM-C) 420, which has a thickness that is less than a minimum critical thickness needed to provide exchange bias for free layer 212; however, antiferromagnetic layer 420 does provide coercivity for free layer 212. Terminals B and C are connected to antiferromagnetic layer 420.

FIG. 4B is a top view of memory cell 400, with bidirectional arrow 440 indicating the switchable direction of magnetization of the free layer 212. As depicted, the shape of MTJ 402 is elliptical in order to maintain thermal stability. However, the shape of antiferromagnetic layer (AFM-C) 420 is rectangular. In some implementations, antiferromagnetic layer (AFM-C) 420 can be milled to be the same width 440 as free layer 212.

In the embodiment of FIGS. 4A and 4B, antiferromagnetic layer (AFM-C) 420 also acts as a source of spin current that exerts torque on free layer 212. That is, antiferromagnetic layer (AFM-C) 420 provides the SHE so there is no need for a separate SHE layer. Write current 422 is applied through the antiferromagnetic layer (AFM-C) 420, between terminals B and C. The write current is applied in one direction to apply a torque on free layer 212 to change the direction of magnetization to IN and in the opposite direction to apply a torque on free layer 212 to change the direction of magnetization to OUT.

Figure 5A:
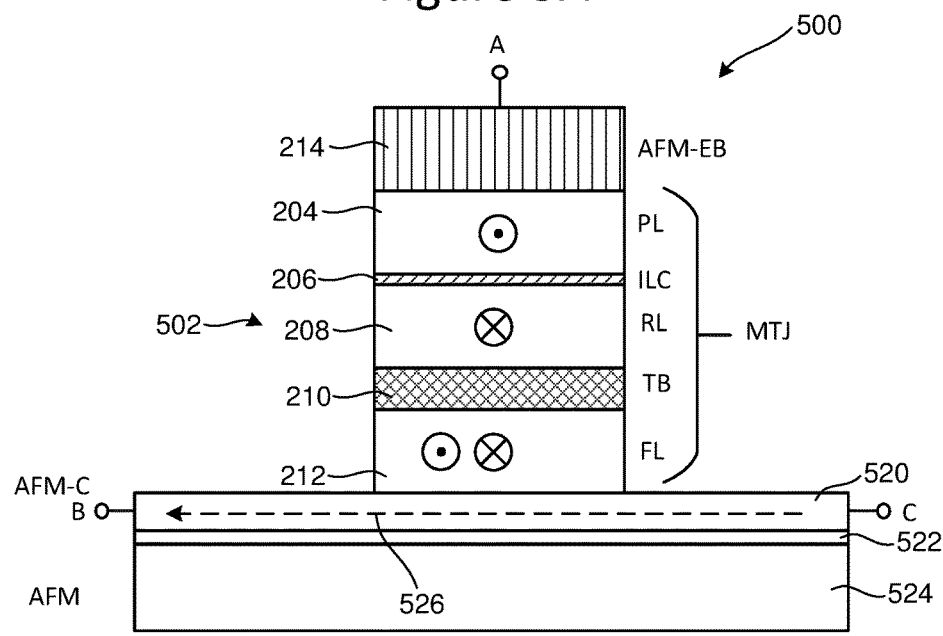
FIG. 5A is a block diagram of a side view of a MRAM memory cell.
Figure 5B:
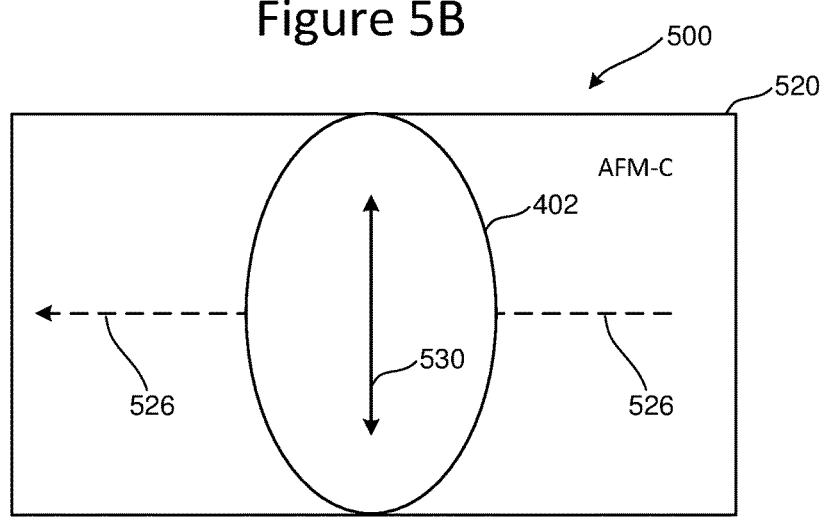
FIG. 5B is a block diagram of a top view of a MRAM memory cell.

FIG. 5A is a schematic perspective view of another embodiment of a MRAM memory cell 500 that exploits SHE and makes use of SOT for switching. FIG. 5B is a top view of memory cell 500. Memory cell 500 includes three terminals A, B and C; and magnetic tunnel junction (MTJ) 502. As depicted, MTJ 502 comprises the same pinned layer (PL) 204, inter-layer coupling (ILC) layer 206, reference layer (RL) 208, tunnel barrier (TB) 210 and free layer (FL) 212 as MTJ 202 of FIG. 2A. Memory cell 500 also includes the same antiferromagnetic layer (AFM-EB) 214 as memory cell 200 of FIG. 2A, at a conventional thickness to provide exchange bias for the pinned layer 204. Terminal A is connected to antiferromagnetic layer 214.

Below MTJ 502, and in contact with free layer 212 of MTJ 402, is antiferromagnetic layer (AFM-C) 520, which has a thickness that is less than a minimum critical thickness needed to provide exchange bias for free layer 212; however, antiferromagnetic layer 520 does provide coercivity for free layer 212. A spacer layer 522 is adjacent the antiferromagnetic layer 520. A second antiferromagnetic layer, antiferromagnetic layer (AFM) 524, is adjacent spacer 522. In one embodiment, spacer 522 is thin, not magnetic and transparent to spin current (i.e., allows spin current to pass through), but breaks any exchange bias from AFM 524. For example, spacer 522 can be made from silver, copper or gold. Terminals B and C are connected to antiferromagnetic layers 524 and/or 520.

FIG. 5B is a top view of memory cell 500, with bidirectional arrow 530 indicating the switchable direction of magnetization of the free layer 212. As depicted, the shape of MTJ 502 is elliptical in order to maintain thermal stability. However, the shape of antiferromagnetic layer (AFM-C) 520, spacer 522 and antiferromagnetic layer (AFM) 524 is rectangular.

In the embodiment of FIGS. 5A and 5B, both antiferromagnetic layers 524 and 520 act as source of spin current that exerts the torque on free layer 212, thereby changing the direction of magnetization of free layer 212. That is, antiferromagnetic layers 524 and 520 both provide the SHE. Write current 526 is applied through both layers between terminals B and C. The write current is applied in one direction to apply a torque on free layer 212 to change the direction of magnetization to IN and in the opposite direction to apply a torque on free layer 212 to change the direction of magnetization to OUT.

Figure 6A:
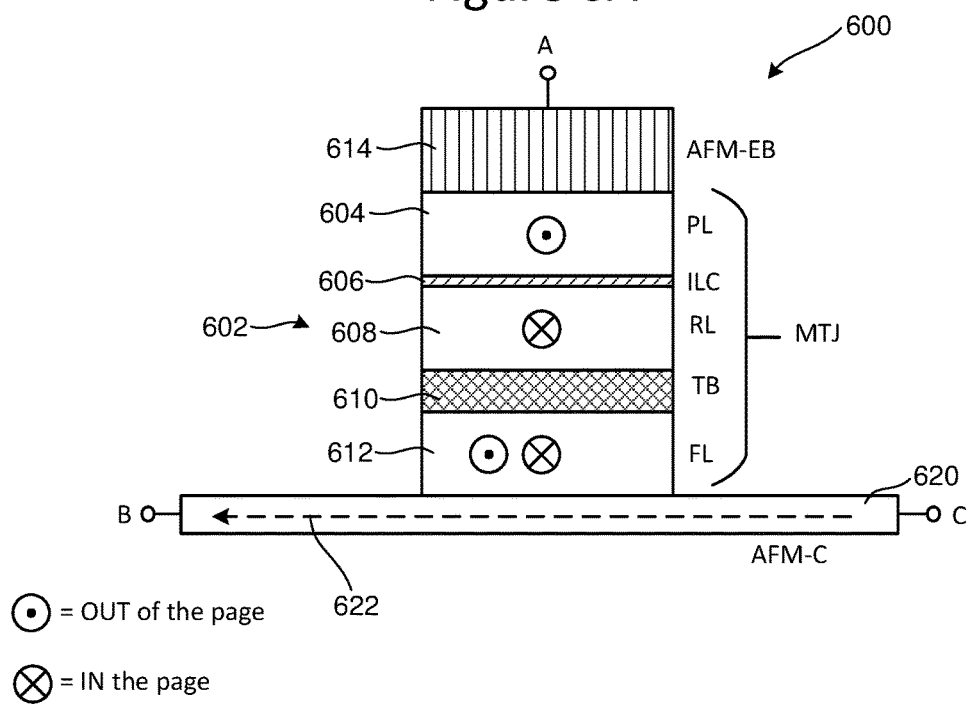
FIG. 6A is a block diagram of a side view of a MRAM memory cell.
Figure 6B:
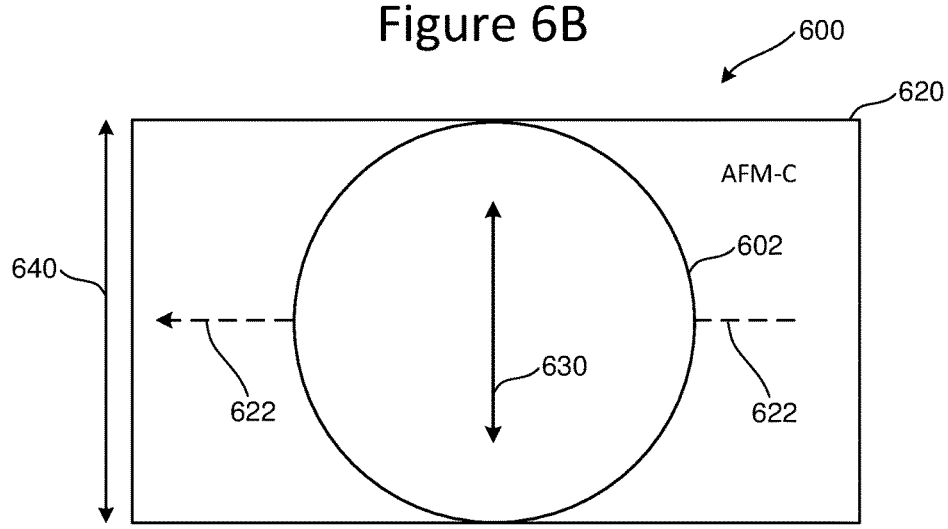
FIG. 6B is a block diagram of a top view of a MRAM memory cell.

FIG. 6A is a schematic perspective view of another embodiment of a MRAM memory cell 600 that exploits SHE and makes use of SOT for switching. FIG. 6B is a top view of memory cell 600. Memory cell 600 includes three terminals A, B and C; and magnetic tunnel junction (MTJ) 602. As depicted, MTJ 602 comprises pinned layer (PL) 604, inter-layer coupling (ILC) layer 606, reference layer (RL) 608, tunnel barrier (TB) 610 and free layer (FL) 612. Memory cell 600 also includes the same antiferromagnetic layer (AFM-EB) 614 in contact with pinned layer 604, at a conventional thickness (e.g., a thickness greater than the minimum critical thickness) to provide exchange bias for the pinned layer 604. Terminal A is connected to antiferromagnetic layer 614.

Below MTJ 602, and in contact with free layer 612 of MTJ 602, is antiferromagnetic layer (AFM-C) 620, which has a thickness that is less than a minimum critical thickness needed to provide exchange bias for free layer 612; however, antiferromagnetic layer 620 does provide coercivity for free layer 612. In one embodiment, antiferromagnetic layer 620 is the same as antiferromagnetic layer 420 of FIG. 4. Terminals B and C are connected to antiferromagnetic layer 620. From the side perspective view of FIG. 6A, the layers of memory cell 600 are similar to the layers of memory cell 400 of FIG. 4A. However, as discussed with respect to FIG. 6B, the shape of MTJ 602 is different than the shape of MTJ 402.

FIG. 6B is a top view of memory cell 600, with bidirectional arrow 630 indicating the switchable direction of magnetization of the free layer 612. As depicted, the shape of MTJ 602 is round or circular (as opposed to elliptical). However, the shape of antiferromagnetic layer (AFM-C) 620 is rectangular. In some implementations, antiferromagnetic layer (AFM-C) 620 can be milled to the same width 640 as free layer 612. Forming MTJ 602 as round allows MTJ to be scaled more aggressively, as it is easier to scale a circle than an ellipse since the minor radius of the ellipse may get too narrow before the major radius is small enough. Prior magnetic tunnel junctions used an elliptical shape to maintain thermal stability. However, it is contemplated that antiferromagnetic layer (AFM-C) 620 will provide the necessary thermal stability on its own, thereby allowing for the round shape. For the same reasons, it is proposed that MTJ 202 of the embodiment of FIG. 2A and MTJ 402 of the embodiment of FIG. 5A can also be implemented in a circular or round shape.

As described above with respect to FIGS. 4A and 4B, antiferromagnetic layer (AFM-C) 620 also acts as a source of spin current that exerts the torque on free layer 612. That is, antiferromagnetic layer (AFM-C) 620 provides the SHE so there is no need for a separate SHE layer. Thus, write current 622 is applied through the antiferromagnetic layer (AFM-C) 620, between terminals B and C. The write current is applied in one direction to apply a torque on free layer 612 to change the direction of magnetization to IN and in the opposite direction to apply a torque on free layer 612 to change the direction of magnetization to OUT.

Figure 7:
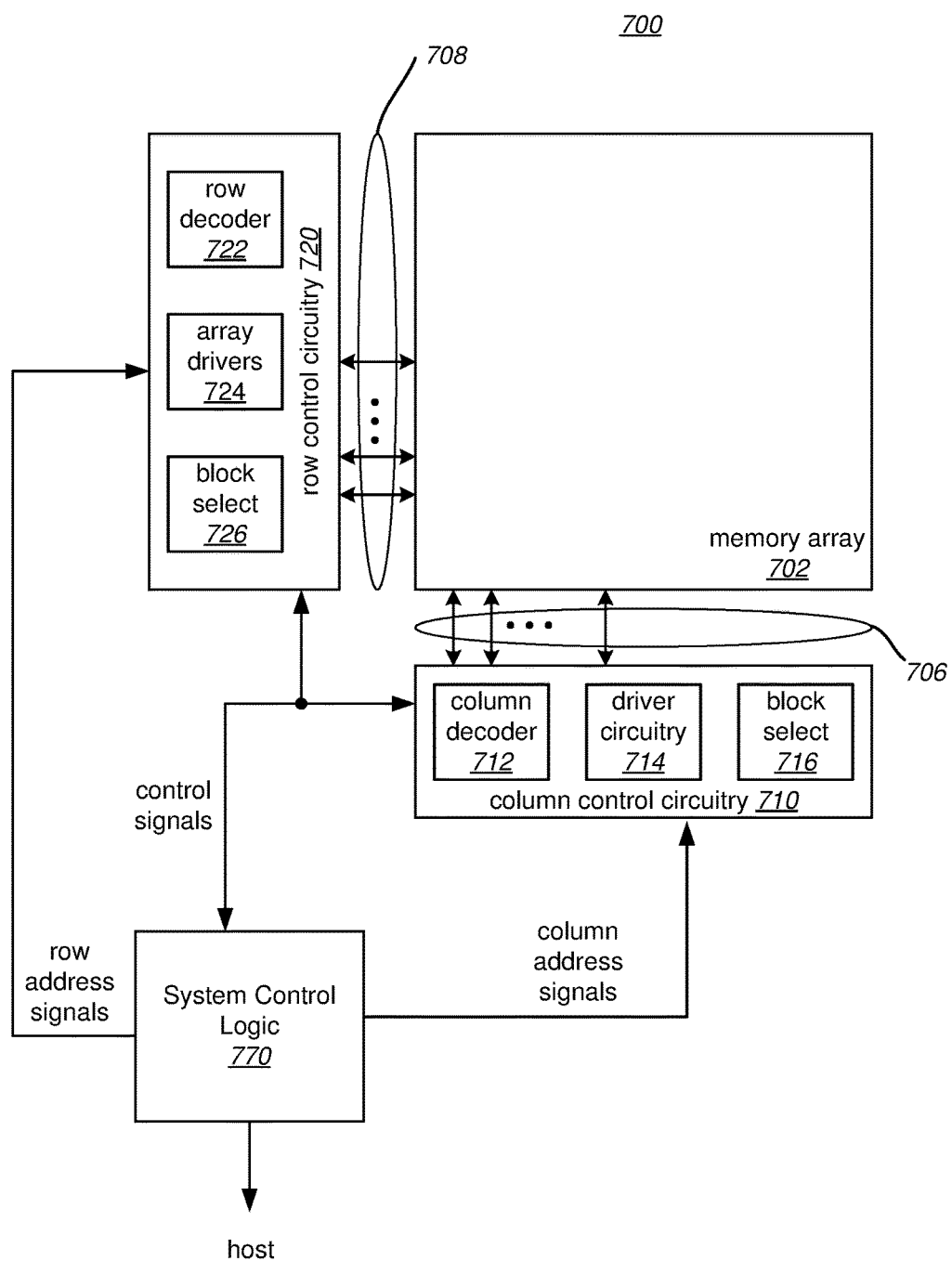
FIG. 7 is a block diagram of a memory system that includes many MRAM memory cells.

FIG. 7 is a block diagram that depicts one example of a memory system 700 that can implement the technology described herein. Memory system 700 includes a memory array 702 that can include thousands or millions of any of memory cells described above. The array terminal lines of memory array 702 include the various layer(s) of word lines organized as rows, and the various layer(s) of bit lines organized as columns. However, other orientations can also be implemented. Memory system 700 includes row control circuitry 720, whose outputs 708 are connected to respective word lines of the memory array 702. Row control circuitry 720 receives a group of M row address signals and one or more various control signals from System Control Logic circuit 770, and typically may include such circuits as row decoders 722, array terminal drivers 724, and block select circuitry 726 for both reading and writing operations. Memory system 700 also includes column control circuitry 710 whose input/outputs 706 are connected to respective bit lines of the memory array 702. Column control circuitry 706 receives a group of N column address signals and one or more various control signals from System Control Logic 770, and typically may include such circuits as column decoders 712, array terminal receivers or drivers 714, block select circuitry 716, as well as read/write circuitry, and I/O multiplexers. System control logic 770 receives data and commands from a host and provides output data to the host. In other embodiments, system control logic 770 receives data and commands from a separate controller circuit and provides output data to that controller circuit, with the controller circuit communicating with the host. System control logic 770 may include one or more state machines, registers and other control logic for controlling the operation of memory system 700.

In one embodiment, all of the components depicted in FIG. 7 are arranged on a single integrated circuit. For example, system control logic 770, column control circuitry 710 and row control circuitry 720 are formed on the surface of a substrate and memory array 702 is a monolithic three dimensional memory array formed above the substrate (and, therefore, above system control logic 770, column control circuitry 710 and row control circuitry 720). In some cases, a portion of the control circuitry can be formed on the same layers as some of the memory array.

Integrated circuits incorporating a memory array usually subdivide the array into a number of sub-arrays or blocks. Blocks are contiguous group of memory cells having contiguous word and bit lines generally unbroken by decoders, drivers, sense amplifiers, and input/output circuits.

In one embodiment, any one or any combination of row control circuitry 720, row decoders 722, array drivers 724, block selects 726, column control circuitry 710, column decoders 712, driver circuitry 714, block select circuits 716 and/or system control logic 770 can be considered a control circuit that is connected to the memory cells of memory array 702 and configured to program non-volatile data into the memory cell by changing the direction of magnetization of the free layers of the memory cells.

One embodiment includes a non-volatile memory cell comprising first ferromagnetic material that has a switchable direction of magnetization and first antiferromagnetic material in contact with the first ferromagnetic material.

One embodiment includes an apparatus comprising a magnetic tunnel junction and a layer of antiferromagnetic material in proximity to the magnetic tunnel junction. The layer of antiferromagnetic material has a thickness that is less than a minimum critical thickness needed to provide exchange bias.

One embodiment includes a method, comprising: applying a write current in a layer of material in proximity to a magnetic tunnel junction; generating spin current in the layer of material due to Spin Hall Effect in response to the write current; passing spin current through an antiferromagnetic material into a free layer of the magnetic tunnel junction; imparting a torque on the free layer by the spin current incoming onto the free layer; and changing direction of magnetization of the free layer in response to the torque.

One embodiment includes an apparatus comprising a magnetic tunnel junction that includes a pinned ferromagnetic layer and a free ferromagnetic layer. The free ferromagnetic layer has a switchable direction of magnetization. The pinned ferromagnetic layer has a fixed direction of magnetization. The apparatus further comprises means for providing coercivity and spin current to the free ferromagnetic layer without providing exchange bias for the free ferromagnetic layer. In one example implementation, the means for providing coercivity and spin current includes antiferromagnetic material in contact with the free ferromagnetic layer.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them. A connection includes an electrical connection or a mechanical connection, and can also include two materials in contact For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a non-volatile memory cell comprising:
a magnetic tunnel junction that includes a free layer and a pinned layer, wherein the free layer comprises a first ferromagnetic layer that has a switchable direction of magnetization; and
a first antiferromagnetic layer in contact with the first ferromagnetic layer, the first antiferromagnetic layer has a thickness that is less than a minimum critical thickness needed to provide exchange bias for the first ferromagnetic layer.

2. The apparatus of claim 1, wherein:
the first antiferromagnetic layer has a thickness such that the first antiferromagnetic layer provides coercivity to the first ferromagnetic layer.

3. The apparatus of claim 1, wherein:
the non-volatile memory cell further comprises a Spin Hall Effect layer in contact with, but separate from, the first antiferromagnetic layer and configured to act as a source of spin current to the magnetic tunnel junction in response to an electrical current across the Spin Hall Effect layer.

4. The apparatus of claim 1, wherein:
the non-volatile memory cell is a SOT MRAM memory cell.

5. The apparatus of claim 1, wherein:
the magnetic tunnel junction further comprises an inter-layer coupling (ILC) layer, a reference layer, and a tunnel barrier;
the inter-layer coupling (ILC) layer is positioned between the pinned layer and the reference layer; and
the tunnel barrier is positioned between the reference layer and the free layer.

6. The apparatus of claim 5, wherein:
the non-volatile memory cell further comprises a second antiferromagnetic layer adjacent the pinned layer; and
the second antiferromagnetic layer has a thickness large enough to provide for exchange bias for the pinned layer.

7. The apparatus of claim 1, wherein:
the magnetic tunnel junction is round.

8. The apparatus of claim 1, wherein:
the MRAM memory cell further comprises a Spin Hall Effect layer in contact with the first antiferromagnetic layer and configured to act as a source of spin current into the first antiferromagnetic layer in response to an electrical current across the Spin Hall Effect layer; and
the first antiferromagnetic layer is positioned between the Spin Hall Effect layer and the first ferromagnetic layer.

9. The apparatus of claim 8, wherein:
the magnetic tunnel junction is elliptical in shape;
the Spin Hall Effect layer is rectangular in shape; and
the first antiferromagnetic layer is elliptical in shape.

10. The apparatus of claim 8, wherein:
the magnetic tunnel junction is elliptical in shape;
the Spin Hall Effect layer is rectangular in shape; and
the first antiferromagnetic layer is rectangular in shape.

11. The apparatus of claim 1, wherein:
direction of magnetization for the first ferromagnetic layer is in plane.

12. The apparatus of claim 1, further comprising
a control circuit connected to the memory cell and configured to program non-volatile data into the non-volatile memory cell by changing the direction of magnetization of the first ferromagnetic layer.

13. The apparatus of claim 1, wherein:
the first antiferromagnetic layer is configured to act as a source of spin current for the first ferromagnetic layer in response to an electrical current across the first ferromagnetic layer.

14. The apparatus of claim 1, wherein:
the non-volatile memory cell further comprises a spacer adjacent the first antiferromagnetic layer and a second antiferromagnetic layer adjacent the spacer, the spacer is transparent to spin current.

15. An apparatus, comprising:
a magnetic tunnel junction; and
a layer of antiferromagnetic material in proximity to the magnetic tunnel junction, the layer of antiferromagnetic material has a thickness that is less than a minimum critical thickness needed to provide exchange bias, spin current is provided to the magnetic tunnel junction via the layer of antiferromagnetic material.

16. The apparatus of claim 15, wherein:
the magnetic tunnel junction includes a pinned layer and a free layer;
the free layer has a switchable direction of magnetization;
the layer of antiferromagnetic material is in contact with the free layer;
the layer of antiferromagnetic material has a thickness such that the layer of antiferromagnetic layer provides coercivity to the free layer; and
the apparatus further comprises a Spin Hall Effect layer in contact with, but separate from, the layer of antiferromagnetic material and configured to act as a source of spin current to the free layer in response to an electrical current across the Spin Hall Effect layer.

17. A method, comprising:
applying a write current in a layer of material in proximity to a magnetic tunnel junction;
generating spin current in the layer of material due to Spin Hall Effect in response to the write current;
passing the spin current from the layer of material into and through an antiferromagnetic material, after passing through the antiferromagnetic material the spin current is injected into a free layer of the magnetic tunnel junction;
imparting a torque on the free layer by the spin current incoming onto the free layer; and
changing direction of magnetization of the free layer in response to the torque.

18. The method of claim 17, wherein:
the antiferromagnetic material is the layer of material in proximity to the magnetic tunnel junction.

19. The method of claim 17, wherein:
the antiferromagnetic material is between the magnetic tunnel junction and the layer of material in proximity to the magnetic tunnel junction.

20. The method of claim 17, wherein:
the antiferromagnetic material has a thickness that is less than a minimum critical thickness needed to provide exchange bias between the antiferromagnetic material and a free layer of the magnetic tunnel junction that is in contact with the antiferromagnetic material.

21. The method of claim 17, wherein:
the applying the write current comprises applying the write current through the layer of material below the magnetic tunnel junction without applying the write current across the magnetic tunnel junction.

22. An apparatus, comprising:
a magnetic tunnel junction comprising a pinned ferromagnetic layer and a free ferromagnetic layer, the free ferromagnetic layer has a switchable direction of magnetization, the pinned ferromagnetic layer has a fixed direction of magnetization; and
means for providing coercivity and spin current to the free ferromagnetic layer without providing exchange bias for the free ferromagnetic layer, the means for providing coercivity and spin current is separate from the pinned ferromagnetic layer.

* * * * *